US010635539B2

(12) United States Patent
Cook et al.

(10) Patent No.: US 10,635,539 B2
(45) Date of Patent: Apr. 28, 2020

(54) SUPPLY VOLTAGE DISTURBANCE IMMUNITY FOR DIGITAL CIRCUITS

(71) Applicant: Allegro MicroSystems, LLC, Manchester, NH (US)

(72) Inventors: Aaron Cook, Deerfield, NH (US); Kenneth Snowdon, Stratham, NH (US); John Waranowski, Weare, NH (US); Virag V. Chaware, Nashua, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 148 days.

(21) Appl. No.: 15/967,822

(22) Filed: May 1, 2018

(65) Prior Publication Data

US 2019/0339985 A1    Nov. 7, 2019

(51) Int. Cl.
| | | |
|---|---|---|
| *G06F 11/00* | (2006.01) | |
| *G06F 11/14* | (2006.01) | |
| *G06F 9/4401* | (2018.01) | |
| *G01R 33/00* | (2006.01) | |
| *G01R 33/06* | (2006.01) | |
| *G06F 1/3212* | (2019.01) | |

(52) U.S. Cl.
CPC ...... *G06F 11/1441* (2013.01); *G01R 33/0023* (2013.01); *G01R 33/06* (2013.01); *G06F 1/3212* (2013.01); *G06F 9/4403* (2013.01)

(58) Field of Classification Search
CPC .......... G11C 16/225; G01D 3/08; G06F 1/24; G06F 1/28; G06F 1/30; G06F 1/305; G06F 11/0721; G06F 11/0751; G06F 11/1402; G06F 11/1441; G06F 11/1469
See application file for complete search history.

(56) References Cited

U.S. PATENT DOCUMENTS

| | | | |
|---|---|---|---|
| 7,369,969 B2 | 5/2008 | Scherr | |
| 8,138,750 B2 | 3/2012 | Fink et al. | |
| 8,736,260 B2 | 5/2014 | Foletto et al. | |
| 9,214,045 B1 * | 12/2015 | Strauss | G07C 5/085 |
| 9,644,999 B2 | 5/2017 | Foletto et al. | |
| 2006/0112296 A1 * | 5/2006 | Sheahan | G06F 11/1441 |
| | | | 714/2 |
| 2010/0052424 A1 | 3/2010 | Taylor et al. | |
| 2011/0208456 A1 * | 8/2011 | Mickelsen | G06F 1/30 |
| | | | 702/64 |
| 2014/0380079 A1 * | 12/2014 | Katano | G06F 11/1441 |
| | | | 713/330 |
| 2015/0058652 A1 * | 2/2015 | Dawley | G06F 1/30 |
| | | | 713/340 |
| 2015/0097607 A1 * | 4/2015 | Wang | G06F 1/305 |
| | | | 327/198 |

(Continued)

*Primary Examiner* — Michael Maskulinski
(74) *Attorney, Agent, or Firm* — Daly, Crowley, Mofford & Durkee, LLP

(57) ABSTRACT

A sensor integrated circuit includes a disturb immune memory configured to store data and a digital processor coupled to the disturb immune memory and including a main register. The digital processor is configured to perform one of a fast reset or slow reset of the main register according to a level of a supply voltage to the integrated circuit. The fast reset includes resetting the main register according to the data stored in the disturb immune memory and the slow reset includes resetting the main register according to a default state.

48 Claims, 9 Drawing Sheets

(56) References Cited

U.S. PATENT DOCUMENTS

| | | | |
|---|---|---|---|
| 2015/0363272 A1* | 12/2015 | Zheng | G06F 11/1456 |
| | | | 714/19 |
| 2017/0117801 A1 | 4/2017 | Shoemaker et al. | |
| 2018/0144985 A1* | 5/2018 | Binzaid | G06F 1/26 |
| 2018/0276092 A1* | 9/2018 | Nelson | G06F 3/0647 |
| 2019/0102261 A1 | 4/2019 | Cesaretti et al. | |

* cited by examiner

SUPPLY VOLTAGE DISTURBANCE IMMUNITY FOR DIGITAL CIRCUITS

CROSS REFERENCE

Not applicable.

STATEMENT REGARDING FEDERALLY SPONSORED RESEARCH

Not applicable.

FIELD OF THE INVENTION

This invention relates generally to sensor integrated circuits and, more particularly, to sensor integrated circuits implementing supply voltage disturbance immunity.

BACKGROUND

In the field of sensing electronics, supply voltage disturbance, or disturb events, are disruptions in the voltage supply to the sensor where the supply voltage either falls below a minimum operating voltage or rises above normal operating conditions. In typical electronics, when the supply voltage falls below a minimum operating voltage, a power on reset will trigger in the digital logic circuits of the devices. Digital logic circuits, such as filters, will experience a delay before they are able to return to normal operating conditions after a power on reset. Because of this delay, readings from the sensing electronics are interrupted until the delay in the digital logic circuits has passed, leading to increased measurement latencies.

SUMMARY

According to the disclosure, a sensor integrated circuit has a power pin coupled to an external power supply that provides a supply voltage. The sensor integrated circuit may further have a regulator for generating a regulated voltage based upon the supply voltage, and a functional circuit. The sensor integrated circuit also has a disturb immune memory configured to store data and a main digital processor coupled to the disturb immune memory. The main digital processor has a main register and is configured to perform a fast reset or slow reset of the main register according to a level of the supply voltage. The fast reset comprises resetting the main register according to the data stored in the disturb immune memory and the slow reset comprises resetting the main register according to a default state.

With this arrangement, benefits of disturb immune memory are achieved, such as decreasing the required reset time of the digital logic. After a disturb event, the data from the disturb immune memory is reloaded into the registers of the main digital processor to return the device back to normal operation quickly.

Features may include one or more of the following individually or in combination with other features. A fast reset circuit can be coupled to the external power supply and receive the supply voltage. The fast reset circuit may be configured to generate a main digital reset signal based upon the level of the supply voltage. In embodiments, the fast reset circuit is configured to detect that the level of the supply voltage is below a predetermined threshold voltage for a first predetermined period of time.

In embodiments, a slow reset circuit can be coupled to the external power supply and receive the supply voltage. The slow reset circuit may be configured to generate a disturb immune memory reset signal based upon the level of the supply voltage. In embodiments, the slow reset circuit is configured to detect that the level of the supply voltage is below the predetermined threshold voltage for a second predetermined period of time, greater than the first predetermined period of time.

In embodiments, a fast over-voltage detection circuit can be coupled to the external power supply and receive the supply voltage. The fast over-voltage detection circuit can be configured to generate a clock blanking signal based upon the level of the supply voltage. In embodiments, the fast over-voltage detection circuit is configured to detect that the level of the supply voltage is above a predetermined over-voltage threshold.

In embodiments, a clock blanking circuit can be coupled to the fast over-voltage detection circuit and the fast reset circuit and receive the clock blanking signal and the main digital reset signal. In embodiments, the clock blanking circuit is configured to block a clock signal provided to the disturb immune memory based upon the clock blanking signal and the main digital reset signal. Further, in embodiments, the clock blanking circuit is also configured to filter at least one partial clock pulse from the clock signal provided to the disturb immune memory.

A storage capacitor can be coupled to receive the regulated voltage and configured to generate an extended regulated voltage for powering the disturb immune memory. A one-way switch can be coupled between the regulator and the storage capacitor. In embodiments, the one-way switch is configured to be closed when the regulated voltage is greater than the extended regulated voltage. In embodiments, the data comprises at least one of a filter parameter or a state machine state.

Also described is a method for resetting a register in a sensor integrated circuit. The method includes storing data in a disturb immune memory and detecting that a level of a supply voltage coupled to the sensor integrated circuit is below a predetermined threshold voltage for a first period of time or for a second period of time longer than the first period of time. The method can also include performing one of a slow reset or fast reset according to whether the supply voltage is below the predetermined threshold voltage for the first period of time or the second period of time. The fast reset can include resetting a main register according to the data stored in the disturb immune memory and the slow reset can include resetting the main register according to a default state.

Features may include one or more of the following individually or in combination with other features. The method may include performing the fast reset when the supply voltage is below the predetermined threshold voltage for a period of time greater than the first period of time and less than the second period of time. Also, the method may include performing the slow reset when the supply voltage is below the predetermined threshold voltage for at least the second period of time.

In embodiments, storing the data comprises storing at least one of a filter parameter or a state machine state.

The method may also comprise providing a clock signal to the disturb immune memory when the main register is reset and detecting that a level of a supply voltage coupled to the sensor integrated circuit is above a predetermined over-voltage threshold. When the level of the supply voltage is above the predetermined over-voltage threshold, the method may include preventing the clock signal from being provided to the disturb immune memory. The method may also include preventing the clock signal from being provided to the disturb immune memory when the level of the supply voltage is below the predetermined threshold voltage.

In embodiments, the method includes detecting that a regulated voltage is below an extended regulated voltage and opening a one-way switch when the regulated voltage is below the extended regulated voltage.

According to a further aspect, a sensor integrated circuit having a power pin for coupling to an external power supply that provides a supply voltage, a regulator for generating a regulated voltage based upon the supply voltage, and a functional circuit, includes means for generating a slow reset signal according to a level of the supply voltage, means for generating a fast reset signal according to the level of the supply voltage, and means for resetting a main register according at least one of the fast reset signal and the slow reset signal.

The sensor integrated circuit may also include means for determining that the level of the supply voltage is less than a predetermined threshold voltage for a period of time, means for determining that the level of the supply voltage is greater than a predetermined over-voltage threshold, means for resetting data stored in a disturb immune memory according to the supply voltage, and/or means for preventing a clock signal from being provided to a disturb immune memory according to the level of the supply voltage.

BRIEF DESCRIPTION OF THE DRAWINGS

The concepts, structures, and techniques sought to be protected herein may be more fully understood from the following detailed description of the drawings, in which.

Figure 1:
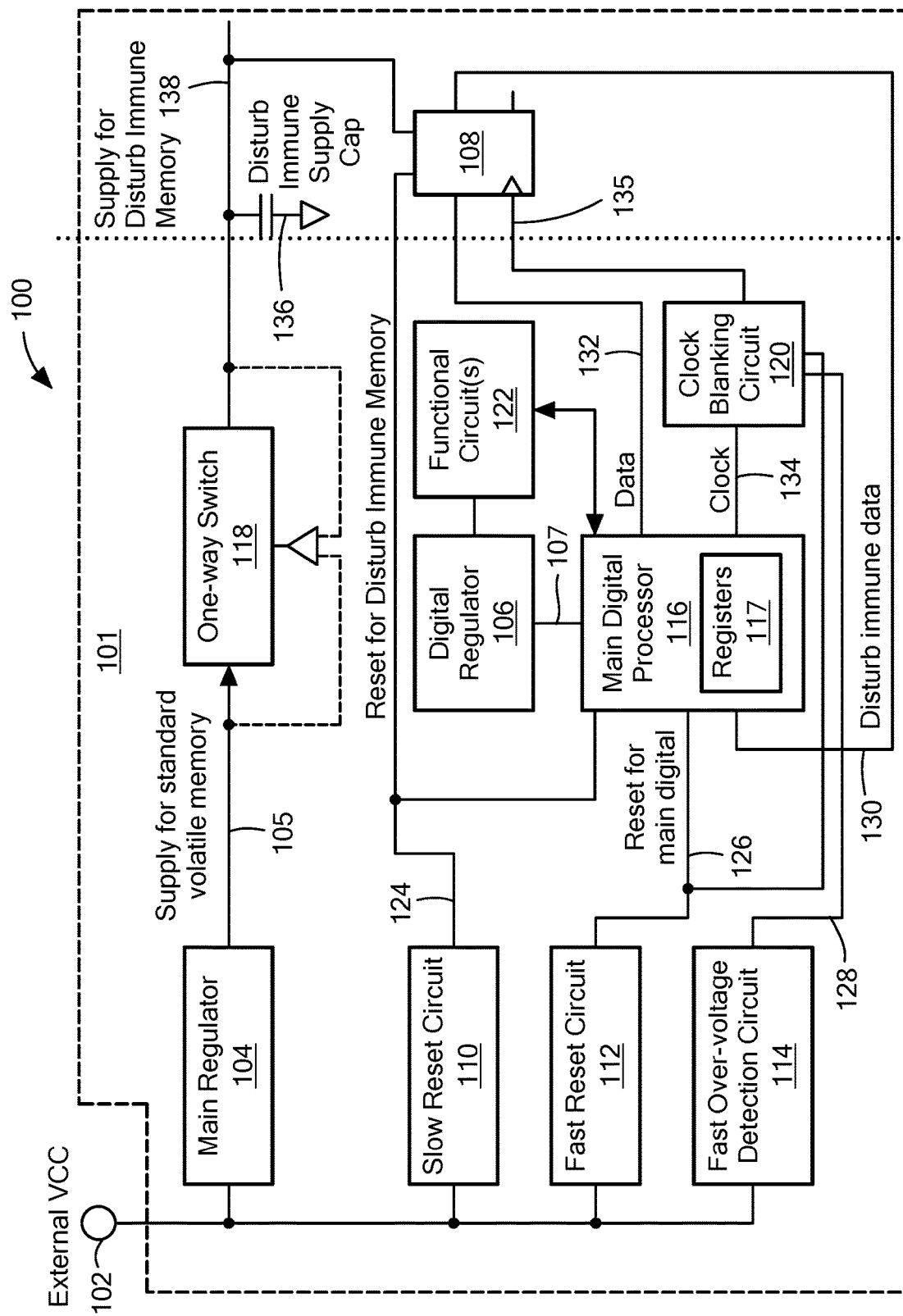
FIG. 1 is a block diagram of a system for disturb immune memory, according to some embodiments.

The drawings are not necessarily to scale, or inclusive of all elements of a system, emphasis instead generally being placed upon illustrating the concepts, structures, and techniques sought to be protected herein.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses one or more magnetic field sensing elements, generally in combination with other circuits. The magnetic field sensor can be, for example, a rotation detector, a movement detector, a current sensor, or a proximity detector.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

In particular, it should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "pulse" is used to describe a signal that begins at a first level or state, transitions rapidly to a second level or state different than the first level and returns rapidly to the first level.

Sensor integrated circuit ("IC") 101 is configured for disturb immune data and includes at least one main regulator 104, at least one digital regulator 106, at least one main digital processor 116, at least one disturb immune memory 108, at least one-way switch 118, functional circuits 122, and disturb immune circuitry at least one slow reset circuit 110, at least one fast reset circuit 112, at least one fast over-voltage detection circuit 114, and at least one clock blanking circuit 120.

Sensor IC 101 may comprise a magnetic field sensor, a pressure sensor, a temperature sensor, or a photo-electric sensor, or any combination thereof—to name a few examples. Functional circuits 122 of sensor IC 101 may comprise sensing elements (also known as transducers) that allow sensor IC 101 to convert one form of energy to another form of energy. For example, functional circuits 122 may comprise one or more Hall effect elements, one or more GMR yokes, one or more photo-diodes, or any combination thereof—to name a few examples. Functional circuits 122 are configured to sense a parameter (such as a magnetic field, temperature, light, or any combination thereof) associated with a target (not shown, such as a magnet, ferromagnetic object, current conductor, etc.) and generate an output signal representative of the parameter for coupling to and further processing by main digital processor 116.

Sensor IC 101 is connected to an external power supply (not shown) by at least one power pin 102. The External power supply is configured to provide at least one of a DC or AC voltage ("VCC") to sensor IC 101. The external power supply may comprise a wall outlet, voltage regulator, invertor, rectifier, a transformer, flyback converter, rectifier, boost converter, buck converter, boost-buck converter, or any combination thereof—to name a few examples. VCC (i.e. the voltage provided from the external power supply) is provided to main regulator 104, digital regulator 106, and the disturb immune circuitry.

Main regulator 104 supplies main regulated voltage 105 to disturb immune memory 108. Main regulated voltage 105 may comprise a DC voltage suitable for volatile memory. Main regulator 104 may comprise a linear regulator, voltage regulator, invertor, rectifier, or any combination thereof—to name a few examples. Likewise, digital regulator 106 supplies digital regulated voltage 107 to main digital processor 116 and functional circuits 122. Digital regulated voltage 124 may comprise a DC voltage needed for the operation of main digital processor 116 and functional circuits 122. Digital regulator 106 may comprise a linear regulator, voltage regulator, invertor, rectifier, or any combination thereof—to name a few examples.

According to some embodiments, either one of main regulator 104 or digital regulator 106 may supply a regulated voltage to disturb immune memory 108, main digital processor 116, and functional circuits 122 necessary for the operation of disturb immune memory 108, main digital processor 116, and functional circuits 122.

In some embodiments, one-way switch 118 may be coupled between main regulator 104 and disturb immune memory 108. One-way switch 118 may comprise a diode, a PMOS pass gate, an NMOS pass gate, or any combination thereof. One-way switch 118 allows current only to flow in one direction (such as from main regulator 104 to disturb immune memory 108) and is configured to block the flow of current when main regulated voltage 105 provided by main regulator 104 is at a level below the voltage 138 at disturb immune memory 108 (i.e. when the voltage 138 at disturb immune memory 108 is greater than main regulated voltage 105).

According to some embodiments, disturb immune supply capacitor 136 may be coupled to supply power to disturb immune memory 108. Disturb immune supply capacitor 136 is configured to keep the level of the voltage 138 supplied to disturb immune memory 108 elevated when main regulated voltage 105 drops, such as during a disturb event. The capacitance value of disturb immune capacitor 136 is based upon the capacitance value needed maintain the voltage 138 at a level above a reset threshold level (e.g. the voltage level at which disturb immune memory 108 would reset). Disturb immune supply capacitor 136 is needed due to the inherent leakage through disturb immune memory 108 and one-way switch 118.

Main digital processor 116 includes registers 117 and comprises a microprocessor, a computer, a storage (such as a random-access memory ("RAM"), read-only memory ("ROM"), programmable memory, flash memory, or any combination thereof—to name a few examples), or any combination thereof—to name a few. Registers 117 comprise a volatile memory (such as, for example, a RAM, a programmable read-only memory (PROM), electronically erasable programmable read-only memory (EEPROM), or any combination thereof—to name a few examples). Registers 117 are configured to store default operating conditions for sensor IC 101. Default operating conditions may comprise data needed for sensor IC 101 to operate after a power cycle (i.e. after sensor IC 101 has powered down and subsequently powered on again). These default operating conditions may include state machine states, digital-to-analog converter output values, filter values, voltage threshold levels, current threshold levels, frequencies, a default sensor output, or any combination thereof—to name a few examples.

According to some embodiments, main digital processor 116 includes operational amplifiers, filters, digital-to-analog converters, clocks, circuits, comparators—or any combination thereof—and is configured to generate a sensor output signal based upon the received output signals from functional circuits 122. For example, main digital processor 116 may amplify, filter, compare, and convert (via a digital-to-analog converter) the output signals received from functional circuits 122 using desired values to generate the sensor output signal. The sensor output signal is representative of the target parameter(s) sensed by functional circuits 122.

In some embodiments, main digital processor 116 is coupled to disturb immune memory 108 and may provide data 132 to disturb memory 108 to be loaded into disturb memory 108. Data 132 comprises known good operating conditions for sensor IC 101. These operating conditions may comprise values determined by main digital processor 116 such as determined state machine states, digital-to-analog converter output values, filter values, voltage threshold levels, current threshold levels, frequencies, a default sensor output, or any combination thereof—to name a few examples. By storing known good operating conditions in disturb immune memory 108, these operating conditions may be reloaded into registers 117 upon sensor 101 being powered on after a reset event, thereby greatly decreasing the time it takes sensor IC 101 to become operational. For example, use of stored good operating conditions reloaded from disturb immune memory 108 brings sensor IC 101 back to normal operation quickly after a power cycle or disturb event.

Disturb immune memory 108 comprises at least one volatile memory such as a D flip-flop, J-K flip-flop, SR flip-flop/latch, or any combination thereof. Disturb immune memory 108 is configured to store known good operating conditions provided from main digital processor 116.

According to some embodiments, main digital processor 116 may generate clock signal 134 that is provided to disturb immune memory 108. In embodiments, main digital processor 116 may generate clock signal 134 when registers 117 are updated or when a reset of registers 117 is triggered. Disturb immune memory 108 is configured to store data 132 provided by main digital processor 116 when a pulse of clock signal 134 is received. According to some embodiments, disturb immune memory 108 may be configured to store data 132 when the rising edge of a clock pulse is received while in other embodiments disturb immune memory 108 may be configured to store data 132 when a falling edge of a clock pulse is received.

Sensor IC 101 further includes disturb immune circuitry. The disturb immune circuitry includes slow reset circuit 110, fast reset circuit 112, fast over-voltage detection circuit 114, and clock blanking circuit 120. The disturb immune circuitry is configured to protect sensor IC 101 against VCC disturb events. A VCC disturb event may include a momentary disruption when the supply voltage to sensor IC 101 falls below a minimum operating voltage (e.g. the minimum voltage level necessary for sensor IC 101 to function properly) or rises above a normal operating voltage (e.g. the voltage level at which sensor IC 101 normally operates). In other words, a disturb event may include a momentary disruption when the voltage level of VCC falls below the minimum operating level or rises above its normal voltage level.

When VCC falls below the minimum operating level, the operating conditions stored in registers 117 may become corrupted, or disturbed. In other words, when VCC falls below the minimum operating level, some of the operating conditions stored in registers 117 may become unusable by sensor IC 101.

The disturb immune circuitry is further configured to store a last known good operating condition of sensor IC 101 in disturb immune memory 108. After the disturb event (such as VCC falling below minimum operating conditions), the last known good operating condition is loaded from disturb immune memory 108 into registers 117. Loading the last known good operating condition into registers 117 greatly decreases the required reset time of main digital processor 116 as sensor IC 101 may continue operation with the last known good operating conditions rather than resetting registers 117 to default values.

Slow reset circuit 110 is configured to reset registers 117 (i.e. return the values stored in registers 117 to default states) if the voltage level of VCC falls below a first voltage level threshold (such as the normal operating voltage level of VCC or a minimum operating voltage level of VCC). Slow reset circuit 110 includes resistors, capacitors, RC filters, comparators, or any combination thereof. As discussed in further detail below with reference to FIG. 2, slow reset circuit 110 is configured to detect that VCC is below a first voltage level threshold for a period of time. Disturb immune memory reset signal 124 may then be generated by slow reset circuit 110 based upon the voltage level of VCC and the detected period of time.

Disturb immune memory reset signal 124 is provided to main digital processor 116 and disturb immune memory 108. Disturb immune memory reset signal 124 includes a value indicating that a slow reset of sensor IC 101 is to occur. For example, in some embodiments a signal held high may indicate a slow reset is to occur and in other embodiments a signal held low may indicate a slow reset is to occur.

When disturb immune memory reset signal 124 is received by main digital processor 116, a slow reset is performed. A slow reset includes reloading registers 117 with default operating conditions. For example, when main digital processor 116 receives disturb immune memory reset signal 124, it may reload registers 117 with default operating conditions, such as, for example, default state machine states.

According to some embodiments, performing a slow reset places main digital processor 116 into a known, non-functional state until the reset condition (such as a VCC disturb event) has passed.

Fast reset circuit 112 is configured to reset main digital processor 116 so that operating conditions stored in disturb immune memory 108 are loaded into registers 117 when the voltage level of VCC falls below the first voltage level threshold. Fast reset circuit 112 operates similarly to slow reset circuit 110 but with a faster response. In other words, conditions for a fast reset are met during quick VCC disturb events while conditions for a slow reset are met during longer VCC disturb events. Fast reset circuit 112 includes resistors, capacitors, MOSFETS, diodes, invertors, or any combination thereof. As discussed below with reference to FIG. 3, fast reset circuit 112 is configured to detect that VCC is operating below a first voltage level threshold level for a period of time. Main digital reset signal 126 may then be generated by fast reset circuit 112 based upon the voltage level of VCC and the detected period of time.

Main digital reset signal 126 may be provided to main digital processor 116 and may comprise a value indicating that a fast reset is to be performed. For example, in some embodiments a signal held high may indicate a fast reset is to occur and in other embodiments a signal held low may indicate a fast reset is to occur.

When main digital reset signal 126 is provided to main digital processor 116, a fast reset is performed. A fast reset includes reloading registers 117 with values stored in disturb immune memory 108. By reloading registers 117 with values stored in disturb immune memory 108, sensor IC 101 will not have to perform certain time-consuming operations in main digital processor 116 after VCC falls below a minimum operating voltage for a brief period of time. In other words, reloading registers 117 with values stored in disturb immune memory 108 shortens the "wake-up" period for sensor IC 101.

Fast over-voltage detection circuit 114 is configured to prevent disturb immune memory 108 from resetting or updating when VCC has risen above a second voltage level threshold (e.g. the normal operating voltage of VCC), also referred to herein as an over-voltage threshold. Specifically, fast over-voltage detection circuit 114 is configured to respond to quick, or fast-moving, rises in VCC, also referred to herein as fast over-voltages. According to some embodiments, a fast over-voltage may be an indication of an upcoming under-voltage, or VCC disturbance, event. Because of this, detecting fast over-voltages helps sensor IC 101 better predict upcoming under-voltage events.

Fast over-voltage detection circuit 114 includes resistors, capacitors, MOSFETS, diodes, invertors, or any combination thereof. As discussed below with reference to FIG. 4, fast over-voltage detection circuit 114 is configured to detect that VCC is operating above a second voltage level threshold. Clock blanking signal 128 may then be generated by fast over-voltage circuit 114 based upon the voltage level of VCC.

Clock blanking signal 128 is provided to clock blanking circuit 120 and comprises a value indicating that clock blanking is to be performed. For example, in some embodiments a signal held high may indicate clock blanking is to occur and in other embodiments a signal held low may indicate clock blanking is to occur.

According to some embodiments, when clock blanking circuit 120 receives clock blanking signal 128, clock blanking is performed. Clock blanking includes preventing clock pulses from being provided to disturb immune memory 108. According to some embodiments, clock blanking circuit 120 may filter all clock pulses from clock signal 134 before being provided to disturb immune memory 108 while clock blanking signal 128 is active.

Clock blanking circuit 120 may include resistors, capacitors, RC filters, MOSFETS, diodes, invertors, digital and/or analog logic gates, or any combination thereof. As discussed in further detail below with reference to FIG. 5, clock blanking circuit 120 is configured to prevent clock signal 134 from being provided to disturb immune memory 108 based upon clock blanking signal 128 and main digital reset signal 126. In other words, clock blanking circuit 120 does not provide clock signal 134 to disturb immune memory 108 based upon clock blanking signal 128 and main digital reset signal 126.

Figure 2:
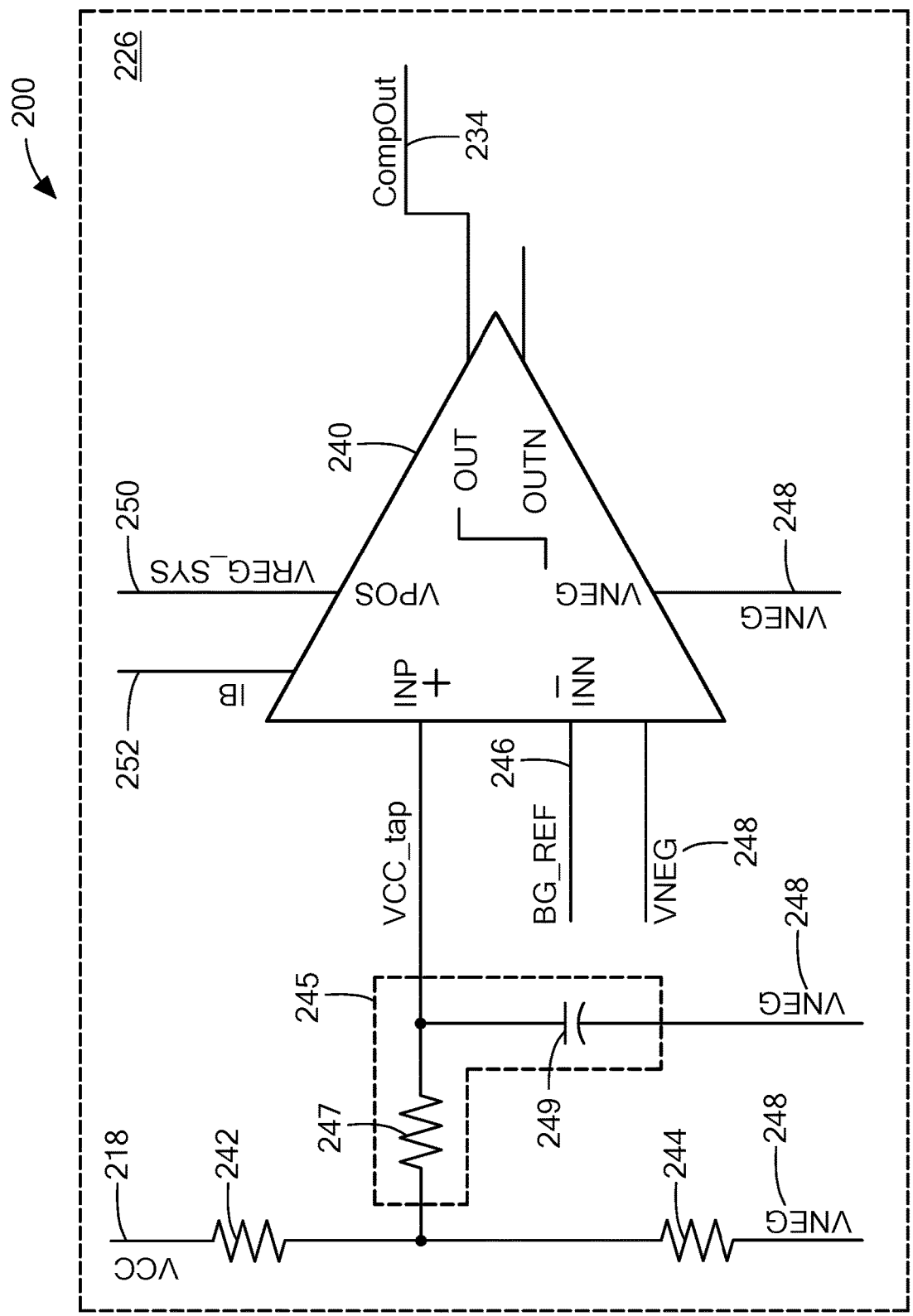
FIG. 2 is a circuit diagram of a slow reset circuit, according to some embodiments.

Referring now to FIG. 2, slow reset circuit 210 (which may be representative of slow reset circuit 110 in the illustrative embodiment of FIG. 1) includes RC filter 245 including resistor 247 and capacitor 249, resistors 242, 244, and operational amplifier 240 and is coupled to supply voltage VCC 218. As discussed above with reference to FIG. 1, slow reset circuit 210 is configured to detect that VCC 218 is operating below a first voltage level threshold for a period of time.

VCC 218 supplied to slow reset circuit 210 is provided to resistors 242 and 244. According to some embodiments, resistors 242 and 244 are configured as a voltage divider that generates a divided VCC voltage. The level of the divided VCC voltage is equal to at least a portion of the voltage level of VCC 218 and is based upon the values of resistors 242 and 244.

The divided VCC voltage is provided to RC filter 245. RC filter 245 of slow reset circuit 210 includes at least one resistor 247 and at least one capacitor 249 and is configured to determine the period of time VCC 218 is operating under a first voltage level threshold. RC filter 245 comprises a filter (such as a low-pass filter) and is configured to filter out any quick VCC transients, such as those seen during a VCC disturbance (i.e. when VCC 218 is operating under the first voltage level threshold), that lasts for a period of time less than a slow reset time threshold. In other words, all VCC transients shorter than the slow reset time threshold are filtered out. For example, in an exemplary embodiment, RC filter 245 may filter out all VCC transients shorter than approximately 100 μs. The slow reset time threshold is based upon the values of the resistors 247 and capacitors 249 of RC filter 245. One of skill in the art will appreciate that a desired slow reset time threshold may be achieved by selecting values for the resistors and capacitors necessary to achieve to the desired slow reset time threshold.

The filtered, divided VCC voltage ("VCC_tap") is provided to operational amplifier 240 which is configured as a comparator. Operational amplifier 240 is configured to compare VCC_tap to a first voltage level threshold to determine if a VCC disturbance has occurred. Operational amplifier 240 is further configured to receive a voltage representing the first voltage level threshold ("BG_REF") 248, a regulated system voltage ("VREG_SYS") (such as the voltage supplied by main regulator 104 or digital regulator 106) 250, and negative voltage ("VNEG") 248. According to some embodiments, operational amplifier 240 may comprise an input offset voltage, or input bias, represented in FIG. 2 as IB.

Operational amplifier 240 is configured to generate disturb immune memory reset signal ("CompOut") 234 based upon the comparison of VCC_tap to the first voltage level threshold BG_REF 246. For example, in some embodiments, when VCC_tap is above the first voltage level threshold BG_REF 248, operational amplifier 240 will generate disturb immunity reset signal 234 at a value equal to VREG_SYS (e.g. a high signal) and at a value of VNEG (e.g. a low signal) when VCC_tap is below the first voltage level threshold. Because a value of VNRG is output when VCC_tap is below the first voltage threshold, disturb immune memory reset signal 234 at a value VNEG indicates that a slow reset is to be performed.

Figure 3:
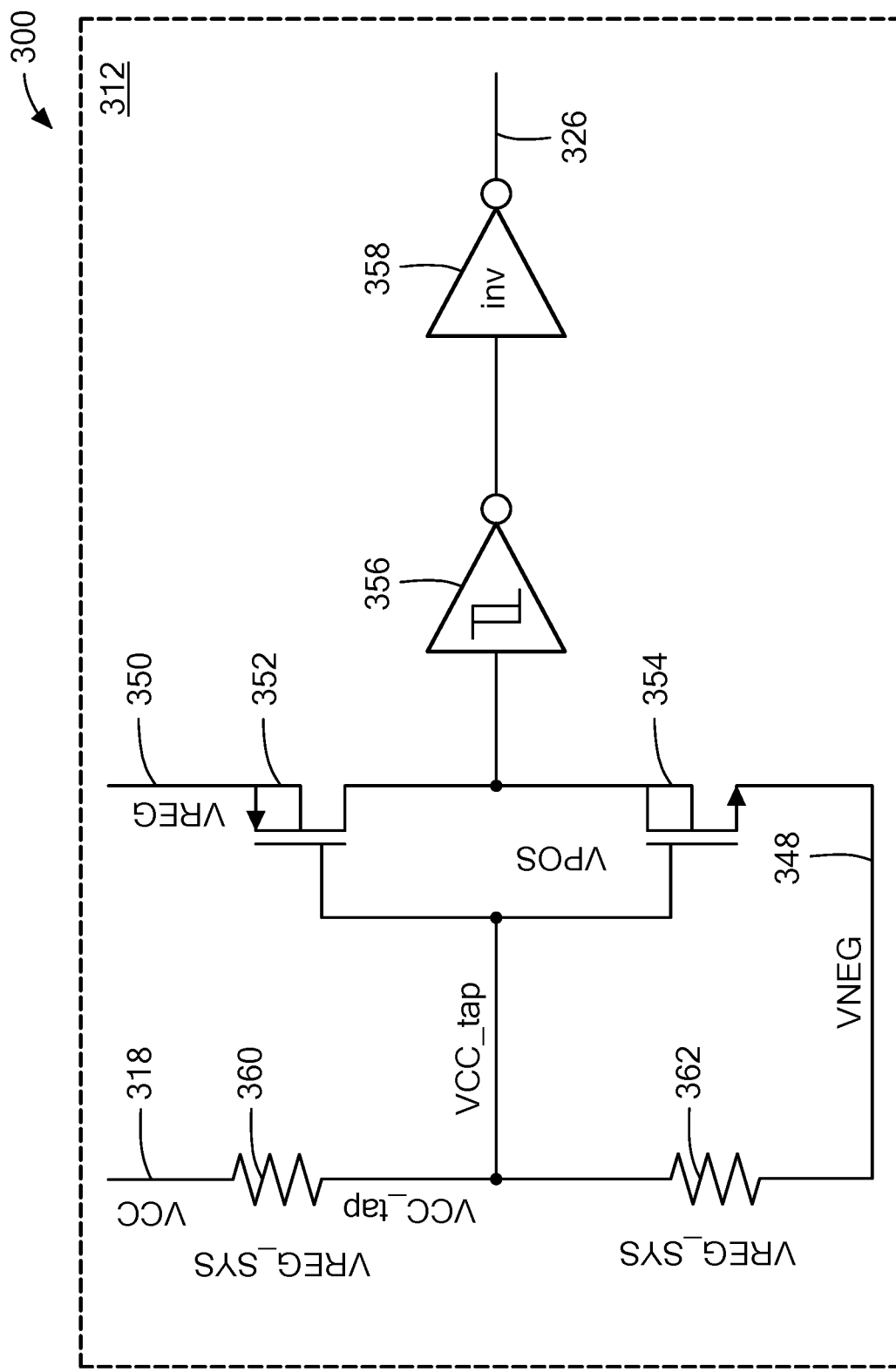
FIG. 3 is a circuit diagram of a fast reset circuit, according to some embodiments.

Referring now to FIG. 3, fast reset circuit 312 (which may be representative of fast reset circuit 112 in the illustrative embodiment of FIG. 1) includes resistors 360, 362, a CMOS inverter (comprising MOSFETS 352, 354), comparator 356, and inverter 358 and is coupled to supply voltage VCC 318. As discussed above with reference to FIG. 1, fast reset circuit 312 is configured to detect that VCC 318 is operating below a first voltage level threshold for a period of time.

Fast reset circuit 312 is configured to detect quick VCC transients with an inherent, minimal delay. For example, fast reset circuit 312 may detect quick VCC transients of less than approximately 1 μs. According to some embodiments, the inherent delay of fast reset circuit 312 may comprise a fast reset time threshold which is shorter than the slow reset time threshold discussed above with reference to FIG. 2.

VCC transients detected by fast reset circuit 312 are provided to resistors 360 and 362. According to some embodiments, resistors 360 and 362 are configured as a voltage divider that generates a divided VCC voltage ("VCC_tap"). The level of VCC_tap is equal to at least a portion of the voltage level of the filtered VCC transient and is based upon the values of resistors 360 and 362.

VCC_tap is provided to the CMOS inverter that includes MOSFETS 352 and 354. MOSFETS 352 and 354 may comprise n-channel MOSETS, p-channel MOSFETS, JFETs, or any combination thereof—to name a few. The CMOS inverter is further coupled to a regulated system voltage ("VREG") 350 (such as the voltage supplied by main regulator 104 or digital regulator 106), and negative voltage ("VNEG") 348.

The CMOS inverter is configured to output VREG 350 or VNEG 348 based upon the voltage level of VCC_tap. For example, when VCC_tap is equal to or above VREG, the CMOS inverter will output VNEG 354 and when VCC_tap is below VREG, CMOS inverter will output VREG.

The output of the CMOS inverter is provided to comparator 356. Comparator 356 may comprise an operational amplifier, MOSFETs, diodes, BJTs, resistors, or any combination thereof. In the illustrative embodiment of FIG. 3, comparator 356 comprises an inverting Schmitt trigger. Comparator 356 is configured to compare the output of the CMOS inverter to a second voltage level threshold. According to some embodiments, the second voltage level threshold may comprise the switching threshold of a Schmitt trigger. One of skill in the art will appreciate that a desired second voltage level threshold may be achieved by selecting values for the Schmitt trigger necessary to achieve the desired second voltage level threshold.

Comparator 356 is configured to generate main digital reset signal 326 based upon a comparison of the output of the CMOS inverter to the second voltage level threshold. For example, in some embodiments, when the output of the CMOS inverter is equal to or above the second voltage level threshold, comparator 356 will generate main digital reset signal 326 as a low output and will generate a high output when the output of the CMOS inverter is below the second voltage level threshold. According to some embodiments, when main digital reset signal 326 is a low output, it indicates that a fast reset is to occur.

In some embodiments, comparator 356 will generate main digital reset signal 326 as a high output when the output of the CMOS inverter is equal to or above the second voltage level threshold and will generate a low output when the output of the CMOS inverter is below the second voltage level threshold. Here, the output of comparator 356 may be provided to logic inverter 358. Inverter 358 is configured to invert the output of comparator 356 so that a main digital signal 326 held low indicates that a fast reset is to be performed.

Figure 4:
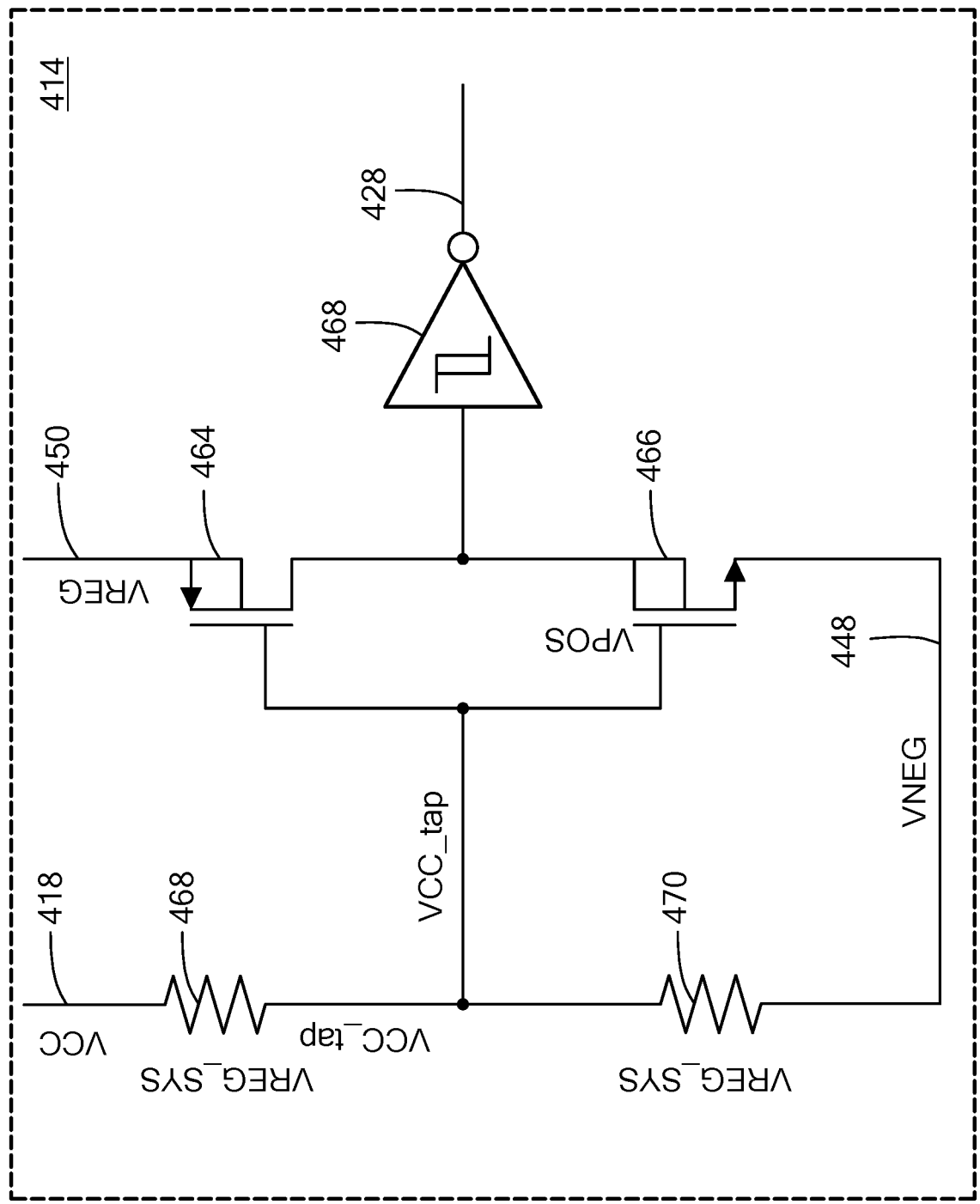
FIG. 4 is a circuit diagram of a fast over-voltage detection circuit, according to some embodiments.

Referring now to FIG. 4, fast over-voltage detection circuit 414 (which may be representative of fast over-voltage detection circuit 114 in the illustrative embodiment of FIG. 1) includes resistors 468, 470, a CMOS inverter (comprising MOSFETS 464, 466), and comparator 468 and is coupled to supply voltage VCC 418. As discussed above with reference to FIG. 1, fast over-voltage detection circuit 414 is configured to prevent disturb immune memory 108 from resetting or updating when VCC has risen above a second voltage level threshold, or over-voltage threshold (e.g. the normal operating voltage of VCC).

Fast over-voltage detection circuit 414 is configured to detect quick VCC transients with a minimal delay. For example, fast over-voltage detection circuit 414 may detect quick VCC transients of less than approximately 1 µs. Any VCC transients detected by fast over-voltage detection circuit 114 are provided to resistors 468 and 470. According to some embodiments, resistors 468 and 470 are configured as a voltage divider that generates a reference VCC voltage ("VCC_tap"). The level of VCC_tap is equal to at least a portion of the voltage level of the detected VCC transients and is based upon the values of resistors 468 and 470.

VCC_tap is provided to the CMOS inverter that includes MOSFETS 464 and 466. MOSFETS 464 and 466 may comprise n-channel MOSETS, p-channel MOSFETS, JFETs, or any combination thereof—to name a few. The CMOS inverter is further coupled to a regulated system voltage ("VREG") 450 (such as the voltage supplied by main regulator 104 or digital regulator 106), and negative voltage ("VNEG") 448.

The CMOS inverter is configured to output VREG 450 or VNEG 448 based upon the voltage level of VCC_tap. For example, when VCC_tap is equal to or above VREG, the CMOS inverter will output VNEG 354 and when VCC_tap is below VREG, the CMOS inverter will output VREG.

The output of the CMOS inverter is provided to comparator 468. Comparator 468 may comprise an operational amplifier, MOSFETs, diodes, BJTs, resistors, or any combination thereof. In the illustrative embodiment of FIG. 4, comparator 468 comprises an inverting Schmitt trigger. Comparator 468 is configured to compare the output of the CMOS inverter to an over-voltage threshold. According to some embodiments, the over-voltage threshold may comprise the switching threshold of a Schmitt trigger. One of skill in the art will appreciate that a desired over-voltage threshold may be achieved by selecting values for the Schmitt trigger necessary to achieve the desired over-voltage threshold.

Comparator 468 is configured to generate clock blanking signal 428 based upon a comparison of the output of the CMOS inverter and the over-voltage threshold. For example, in some embodiments, when the output of the CMOS inverter is equal to or above the over-voltage threshold, comparator 468 will generate clock blanking signal as a high output and will generate a low output when the output of the CMOS inverter is below the over-voltage level threshold. According to some embodiments, when clock blanking signal 428 is a low output, it indicates that clock blanking is to be performed.

Figure 5A:
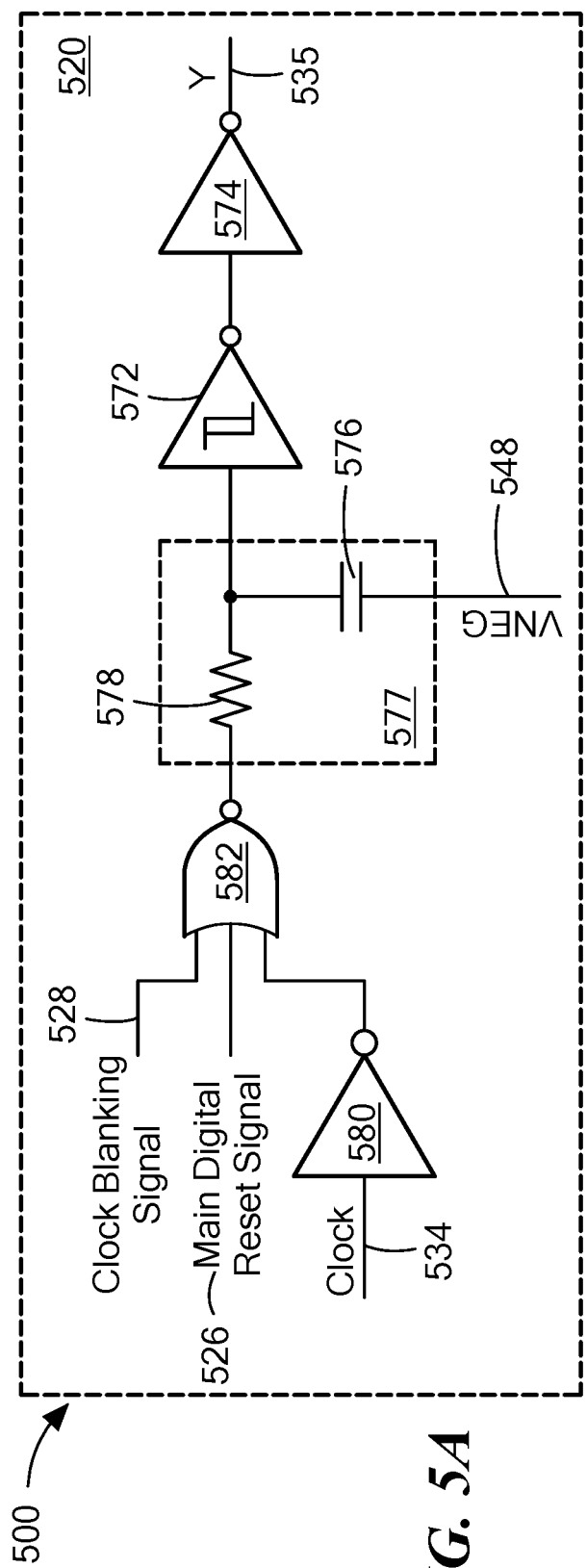
FIG. 5A is a circuit diagram of a clock blanking circuit, according to some embodiments.
Figure 5B:
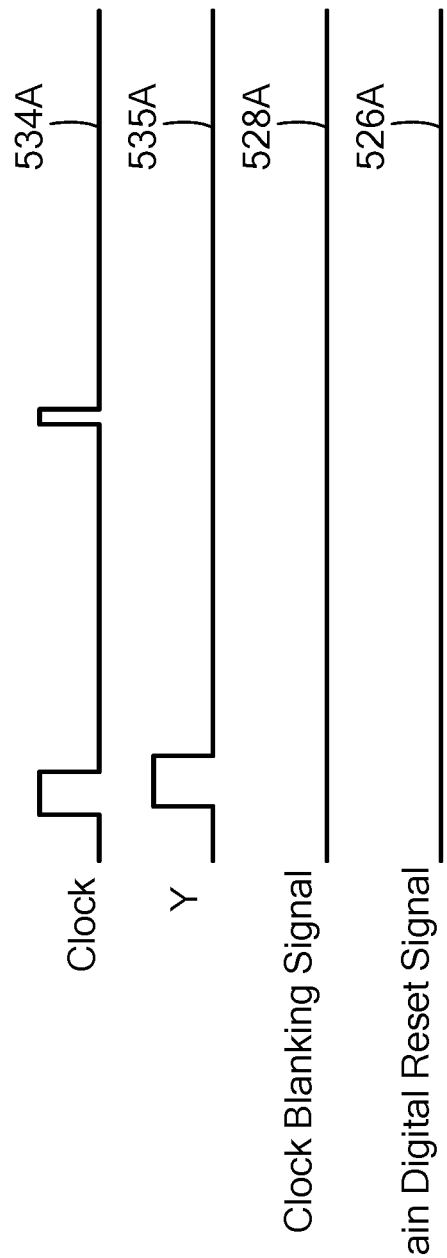
FIG. 5B is a signal plot of signals within a clock blanking circuit, according to some embodiments.

Referring now to FIG. 5, clock blanking circuit 520 includes RC filter 577 (including resistor 578 and capacitor 576), comparator 572, inverters 574, 580, and at least one logic gate 582. Clock blanking circuit 520 is configured to receive clock signal 534 from main digital processor 116, clock blanking signal 528 from fast over-voltage circuit 414, and main digital reset signal 526 from fast reset circuit 312. As discussed above with reference to FIG. 1, clock blanking circuit 520 is configured to prevent clock signal 534 from being provided by main digital processor 116 to disturb immune memory 108 under certain conditions.

In some embodiments, clock blanking circuit 520 is configured to prevent clock signal 534 from being provided to disturb immune memory 108 when either clock blanking signal 528 or main digital reset signal 526 is active. Clock blanking circuit 520 includes at least one logic gate 582 that receives clock blanking signal 528, main digital reset signal 526, and clock signal 534. Logic gates 582 may comprise analog or digital logic gates such as AND gates, NAND gates, OR gates, NOR gates, XOR gates, XNOR gates, inverters—or any combination thereof. Logic gates 582 are configured so that a low, or FALSE, output will occur when either clock blanking signal 528, main digital reset signal 526, or both are active. In other words, logic gates 582 are configured to prevent clock signal 534 from being provided to disturb immune memory 108 when either a fast over-voltage has been detected or when a fast reset is to occur.

For example, in the illustrative embodiment of FIG. 5, assume that clock blanking signal 528 being held high indicates that clock blanking signal 528 is active (i.e. clock blanking signal 528 indicates that clock blanking is to occur) and main digital reset signal 526 being held high indicates that main digital reset signal 526 is active (i.e. main digital reset signal 526 indicates that a fast reset is to occur). In the illustrative embodiment of FIG. 5, logic gates 582 are represented as a NOR gate with three inputs (clock blanking signal 528, main digital reset signal 526, and the inverse of clock signal 534). Logic gates 582 are configured so that if clock blanking signal 528, main digital reset signal 526, or both are active, then logic gates 582 will output low, or FALSE, preventing clock signal 534 from being passed to disturb immune memory 108.

Preventing the clock signal 534 from being provided to disturb immune memory 108 when either a fast over-voltage has been detected or a fast reset is to occur prevents disturb immune memory 108 from updating when a VCC disturbance is imminent (as indicated by clock blanking signal 528) or when a VCC disturbance is ongoing (as indicated by main digital reset signal 526). This prevents corrupted, or disturbed, operating conditions from being loaded into disturb immune memory 108.

According to some embodiments, clock blanking circuit 520 is further configured to filter out partial clock signals from main digital processor 116 before they are provided to disturb immune memory 108. A partial clock signal may include a clock pulse that is shorter than the minimum hold time required by disturb immune memory 108. Filtering these partial clock signals avoids corruption of the disturb immune data stored in disturb immune memory 108. To filter these partial clock signals, clock blanking circuit 520 includes RC filter 577 comprising resistor 578 and capacitor 576. RC filter 577 comprises a filter (such as a low-pass filter) and is configured to filter out any clock pulses that are shorter than a clock hold threshold. The clock hold threshold is based upon the values of resistor 578 and capacitor 576. One of skill in the art will appreciate that a desired clock hold threshold may be achieved by selecting values for resistor 578 and capacitor 576 necessary to achieve to the desired clock hold threshold.

Any clock pulses not filtered out by RC filter 577 are provided to comparator 572. Comparator 572 may comprise an operational amplifier, MOSFETs, diodes, BJTs, resistors, or any combination thereof. In the illustrative embodiment of FIG. 5, comparator 572 comprises an inverting Schmitt trigger. Comparator 572 is configured to compare the filtered clock pulses to a clock level threshold. In other words, comparator 572 compares the clock pulses to a desired voltage level for the clock pulses. According to some embodiments, the clock level threshold may comprise the switching threshold of a Schmitt trigger. One of skill in the art will appreciate that a desired over-voltage threshold may be achieved by selecting values for the Schmitt trigger necessary to achieve the desired clock level threshold.

When comparator 572 receives clock pulses equal to or above the clock level threshold, a low signal is output and a high signal is output when clock pulses under the clock level threshold are received. By comparing the clock pulses to a clock level threshold, partial clock pulses that are at a lower voltage than the clock level threshold are removed from the signal. This further helps to avoid data corruption in disturb immune memory 108. Because the output of comparator 572 is an inverse of a filtered clock signal, the output of comparator 572 is provided to logic inverter 574. Inverter 574 is configured to invert the output of comparator 572 is generate filtered clock signal 535.

FIG. 5A is a signal plot representing the filtering of partial clock pulses. Clock signal A 534A provided to clock blanking circuit 520 by main digital processor 116 comprises a first clock pulse and a second partial clock pulse. Clock output Y 535A, generated by clock blanking circuit 520 shows that the first clock pulse is allowed to pass while the partial clock pulse was filtered out due to clock blanking circuit 520.

Further, because both clock blanking signal 528A and main digital reset signal 526A are not active (here represented as being held low), the clock signal is allowed to pass from main digital processor 116 to disturb immune memory 108 after being filtered for partial clock pulses.

Figure 6A:
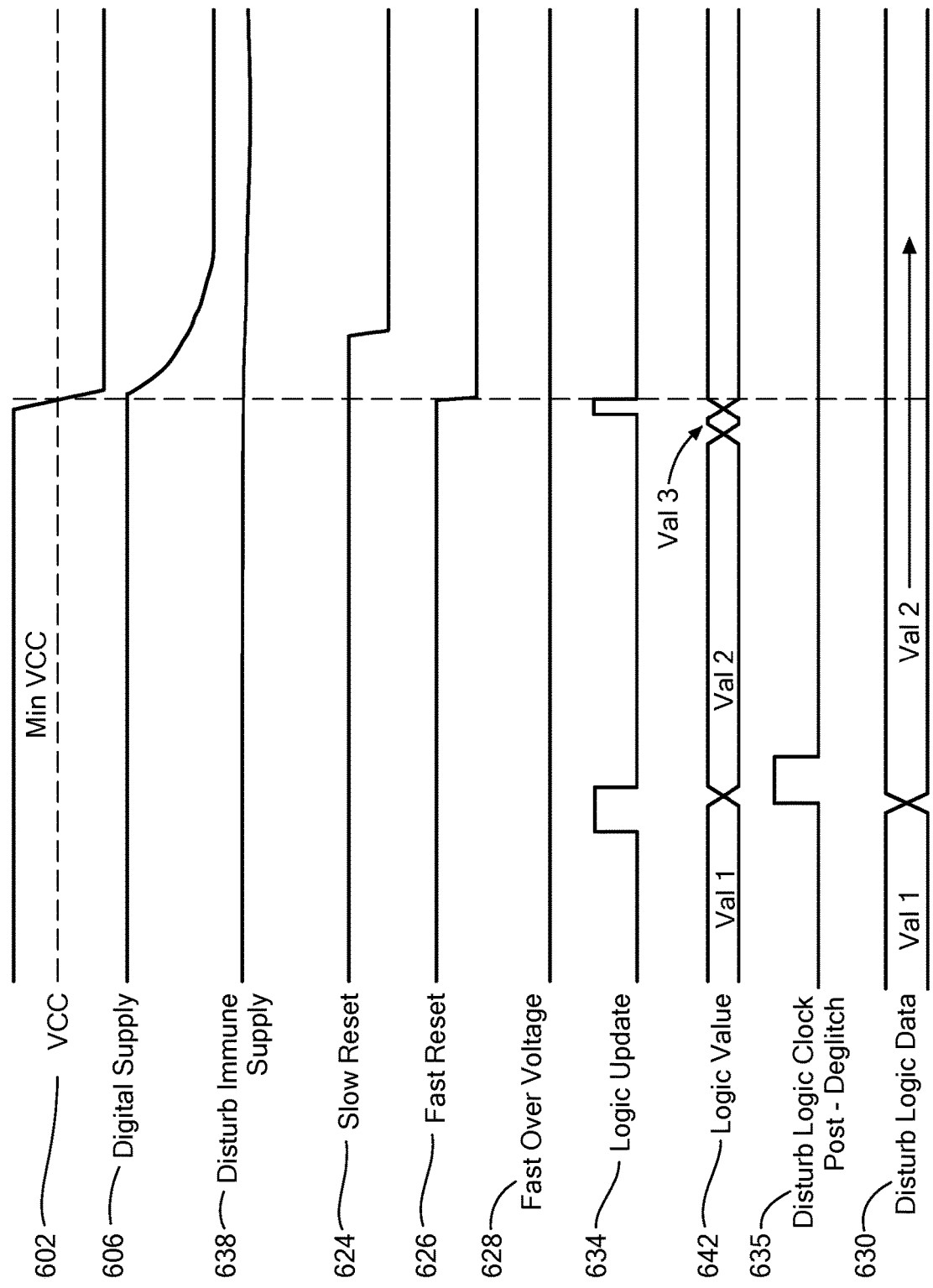
FIG. 6A is a signal plot of the signals within a system for disturb immune memory, according to some embodiments.

FIG. 6A is a signal plot representing the signals generated by sensor IC 101 during VCC disturbances. Signal 602 represents VCC as it falls below a minimum operating voltage ("min VCC"), resulting in a VCC disturbance. Signal 606 represents the digital regulated voltage supplied by digital regulator 106. Because digital regulator 106 is powered by VCC 602, as VCC 602 falls below a minimum operating voltage, so does digital regulated voltage 606.

Signal 638 represents the voltage 138 supplied to disturb immune memory 108. Because disturb immune supply capacitor 136 is configured to keep the level of the voltage 138 supplied to disturb immune memory 108 elevated, the voltage 138 supplied to disturb immune memory 108 does not fall with digital regulated voltage 606 or VCC 602.

Signal 624 represents the disturb immune memory reset signal generated by slow reset circuit 110. As discussed above with reference to FIG. 2, slow reset circuit 110 is configured to generate disturb immune memory reset signal 624 when VCC 602 has fallen below a minimum operating voltage for a predetermined amount of time (such as a slow reset time threshold). Because of this, signal 624 generated by slow reset circuit 110 goes from high to low (here indicating a slow reset is to occur) after VCC has fallen below a minimum operating voltage for a predetermined amount of time.

Signal 626 represents the main reset signal generated by fast reset circuit 112. As discussed above with reference to FIG. 3, fast reset circuit 112 is configured to generate main reset signal 624 when VCC 602 has fallen below a minimum operating voltage for a predetermined amount of time (such as a fast reset time threshold) that is shorter than the predetermined amount of time needed for a slow reset. Because of this, signal 626 generated by fast reset circuit 112 goes from high to low (here indicating for a fast reset to occur) after VCC 602 has fallen below a minimum operating voltage for a predetermined amount of time shorter than the predetermined amount of time needed for a slow reset.

Signal 628 represents the clock blanking signal generated by fast over-voltage detection circuit 114. As discussed above with reference to FIG. 4, fast over-voltage detection circuit 114 is configured to generate clock blanking signal 628 when VCC has risen above an over-voltage threshold. Here, because VCC has not risen above an over-voltage threshold, there is no change in clock blanking signal 628.

Signal 642 represents values stored in registers 117. The logic stored in registers 117 starts at an initial value ("val1") and is updated to a second value ("val2"). As VCC 602 falls under the minimum operating voltage level, the logic stored in registers 117 is updated to a third value ("val3"). Because VCC 602 falls below the minimum operating voltage, val3 becomes corrupted, or disturbed.

Signal 634 represents the clock signal provided by main digital processor 116 to clock blanking circuit 120. Here, signal 634 comprises a full clock pulse and a partial clock pulse. Signal 635 represents the clock signal provided from clock blanking circuit 120 to disturb immune memory 108. As can be seen here, only the full clock pulse of clock signal 634 has been allowed to pass and the partial clock pulse has been filtered out.

Signal 630 represents values stored in disturb immune memory 108 being updated according to clock signal 635. The logic stored in disturb immune memory 108 starts at an initial value ("val1") and is updated to a second value ("val2") at the rising edge of the clock pulse. Because the partial clock pulse from signal 634 has been filtered out, the logic stored in disturb immune memory 108 does not update to val3 which became corrupted, or disturbed, due to VCC 602 falling below the minimum operating voltage. Further, because disturb immune supply 630 does not fall beneath the minimum operating voltage level, the logic stored in disturb immune memory 108 when VCC 602 falls below the minimum operating voltage (val2) does not become corrupted, or disturbed.

Figure 6B:
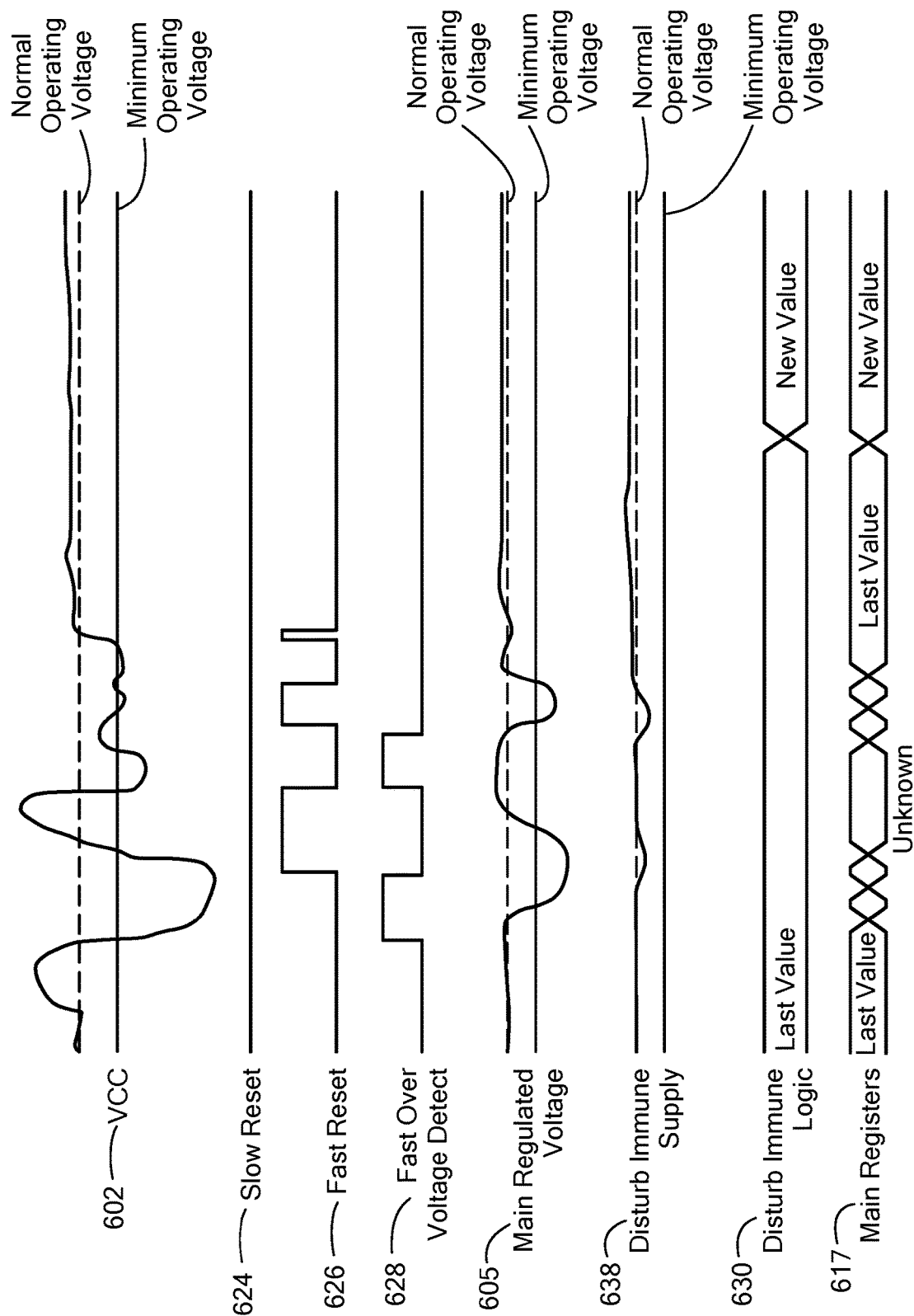
FIG. 6B is a signal plot of the signals within a system for disturb immune memory, according to some embodiments.

FIG. 6B is a signal plot representing the signals generated by sensor IC 101 during under-voltage and over-voltage events. Signal 602 represents VCC as it both rises above normal operating conditions and falls below a minimum operating voltage, resulting in VCC disturbances.

Signal 624 represents the disturb immune memory reset signal generated by slow reset circuit 110. As discussed above with reference to FIG. 2, slow reset circuit 110 is configured to generate disturb immune memory reset signal 624 when VCC 602 has fallen below a minimum operating voltage for a predetermined amount of time. Because the period of time that VCC 602 falls below the minimum operating voltage is less than the predetermined amount of time (e.g. the slow reset time threshold), signal 624 generated by slow reset circuit 110 remains low (here indicating that no slow reset is to occur).

Signal 626 represents the main reset signal generated by fast reset circuit 112. As discussed above with reference to FIG. 3, fast reset circuit 112 is configured to generate main reset signal 624 when VCC 602 has fallen below a minimum operating voltage for a predetermined amount of time that is shorter than the predetermined amount of time needed for a slow reset. Because of this, signal 626 generated by fast reset circuit 112 goes from low to high (here indicating for a fast reset to occur) each time that VCC 602 falls below the minimum operating voltage for a predetermined amount of time shorter than the predetermined amount of time needed for a slow reset.

Signal 628 represents the clock blanking signal generated by fast over-voltage detection circuit 114. As discussed above with reference to FIG. 4, fast over-voltage detection circuit 114 is configured to respond to quick, or fast-moving, rises in VCC 602, or fast over-voltages. Because of this, signal 628 generated by fast over-voltage detection circuit 114 goes from low to high (here indicating for clock blanking to occur) while VCC 602 rises above normal operating conditions.

Signal 605 represents the main regulated voltage supplied by main regulator 104. Because main regulator 104 is powered by VCC 602, as VCC 602 falls below the minimum operating voltage, so does main regulated voltage 605.

Signal 638 represents the voltage 138 supplied to disturb immune memory 108. Because disturb immune supply capacitor 136 is configured to keep the level of the voltage 138 supplied to disturb immune memory 108 elevated, the voltage 138 supplied to disturb immune memory 108 does not fall with main regulated voltage 605 or VCC 602. Here, the voltage 138 supplied to disturb immune memory remains effectively constant with only nominal falls in voltage.

Signal 630 represents values stored in disturb immune memory 108. The logic stored in disturb immune memory 108 starts at an initial value ("Last Value") and is updated to a second value ("New Value") when VCC 602 has returned to normal operating voltage level. The values stored in disturb immune memory 108 may be updated (i.e. have values loaded in from registers 117), for example, periodically independent of any slow or fast resets.

Signal 617 represents the values stored in registers 117. The logic stored in registers 117 starts at an initial value ("Last Value"). Because VCC 602 falls below a minimum operating voltage, the logic stored in registers 117 may become corrupted, or disturbed. Because the logic stored in registers 117 may be corrupted, or disturbed, the values of the logic stored in disturb immune logic 108 are loaded into registers 117. In this case, the value Last Value is loaded from disturb immune memory 108 into registers 117. Once VCC 602 has returned to normal operating conditions, registers 117 are updated with a new value ("New Value") by main digital processor 116.

Figure 7:
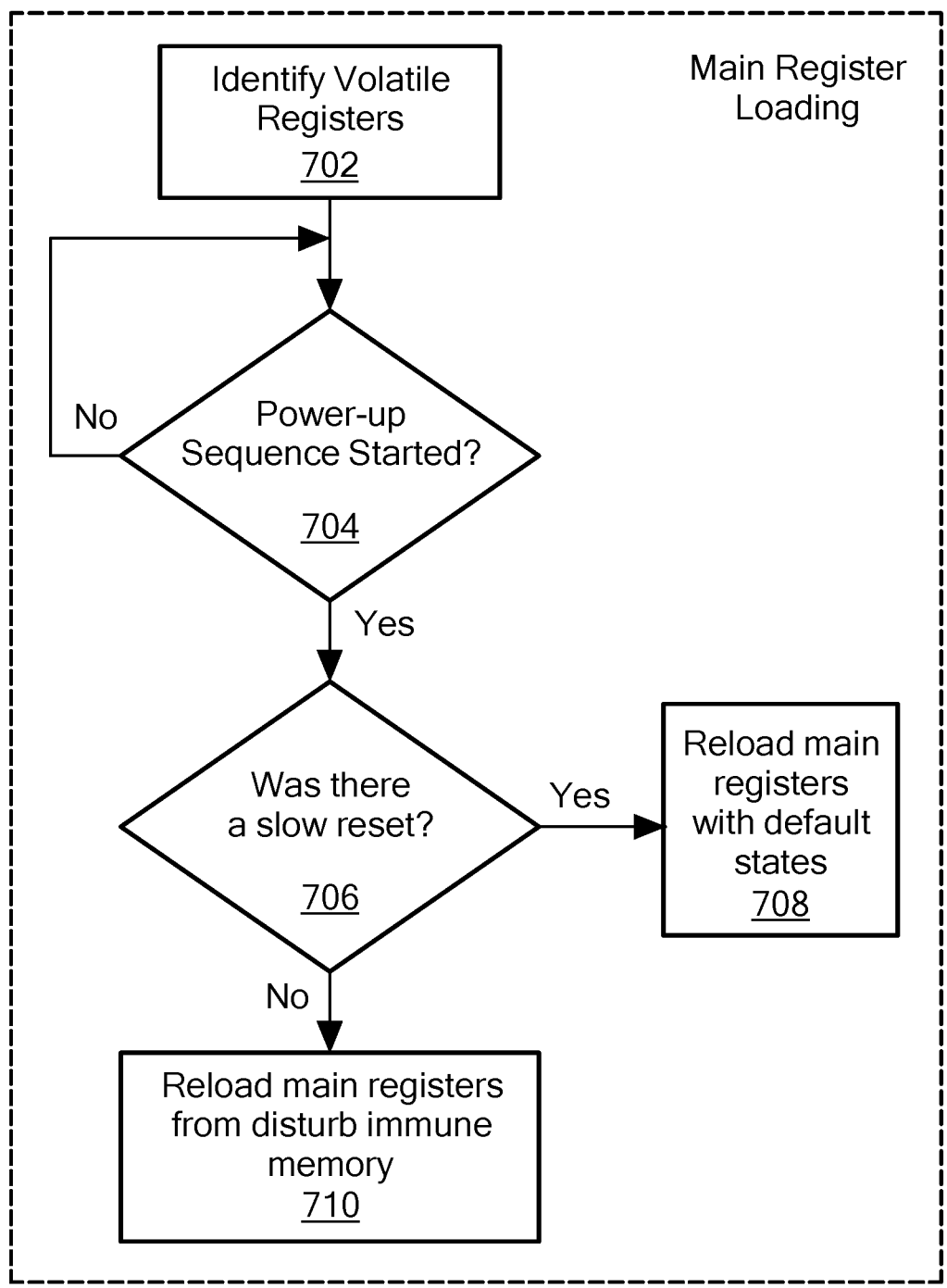
FIG. 7 is a flow diagram illustrating a process for reloading the main registers of the main digital processor, according to some embodiments.

FIG. 7 is a flowchart for main register loading, according to an embodiment. At 702 volatile registers (such as registers 117) of main digital processor 116 are identified. At 704, sensor IC 101 determines whether a power-up sequence has started. If a power-up sequence has started then the system moves to 706, otherwise 704 is repeated. According to some embodiments, a power-up sequence may comprise supply voltage VCC rising above a minimum operating voltage level after falling below the minimum operating voltage level (i.e. supply voltage VCC returning to at least the minimum operating voltage level).

At 706, main digital processor 116 determines whether a slow reset occurred. According to some embodiments, main digital processor 116 may determine whether a slow reset occurred based upon whether disturb immune memory reset signal 124 is active. If a slow reset did occur, then the system moves to 708, otherwise the system moves to 710.

At 708, when a slow reset has occurred, registers 117 are reloaded with default operating conditions. For example, registers 117 may be reloaded with default state machine states. At 710, when no slow reset has occurred, a fast reset occurs, reloading registers 117 from the logic stored in disturb immune memory 108.

Figure 8:
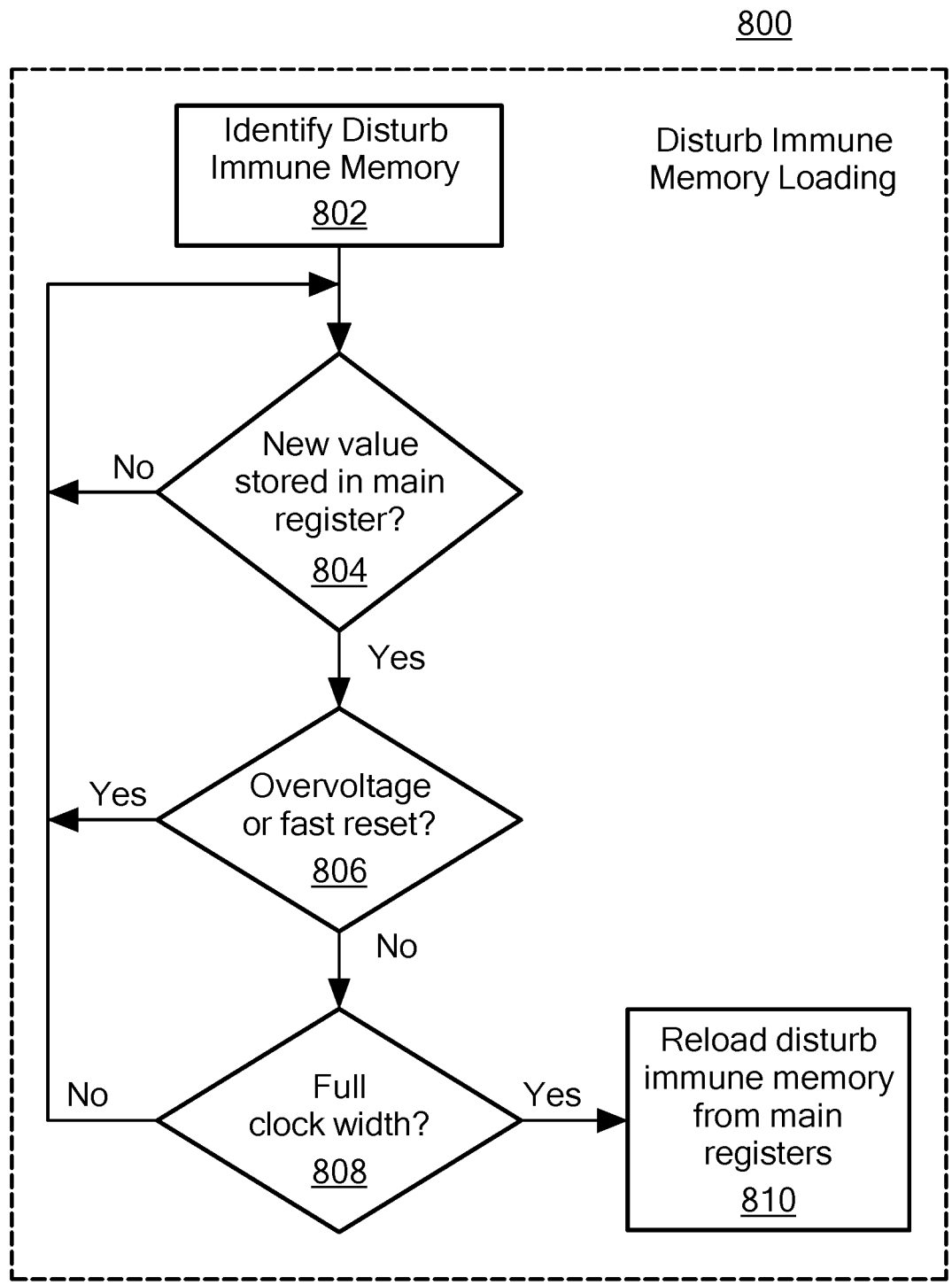
FIG. 8 is a flow diagram illustrating a process for reloading the disturb immune memory, according to some embodiments.

FIG. 8 is a flowchart for disturb immune memory loading, according to an embodiment. At 802 the logic stored in disturb immune memory 108 is identified. At 804, the system detects whether a new value (for example, a value difference from the value stored in disturb immune memory 108) is stored in registers 117. If there is no new value stored in registers 117 then the system repeats 804, otherwise the system moves on to 806.

At 806, clock blanking circuit 120 detects whether clock blanking signal 128, main digital reset signal 126, or both are active. According to some embodiments clock blanking signal and main digital reset signal 126 are active when held high and in other embodiments are active when they are held low. If clock blanking circuit 120 detects that clock blanking signal 128, main digital reset signal 126, or both are active, then the system moves to 804, otherwise the system moves to 808.

At 808, clock blanking circuit 120 determines whether a full clock pulse has been received from main digital processor 116. If a full clock pulse has been received, then the system moves to 810. If no clock pulse or a partial clock pulse have been received, then the system moves to 804.

At 810, clock blanking circuit 120 has allowed the clock signal to pass from main digital processor 116 to disturb immune memory 108. Further, at 810 the logic stored in disturb immune memory 108 is reloaded with the values stored in registers 117.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored in a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A sensor integrated circuit having a power pin for coupling to an external power supply that provides a supply voltage, a regulator for generating a regulated voltage based upon the supply voltage, and a functional circuit, comprising:
    a disturb immune memory configured to store data;
    a digital processor coupled to the disturb immune memory and comprising a main register, wherein the digital processor is configured to:
        perform one of a fast reset or slow reset of the main register according to a level of the supply voltage;
        wherein the fast reset comprises resetting the main register according to the data stored in the disturb immune memory; and
        wherein the slow reset comprises resetting the main register according to a default state; and
    a fast reset circuit coupled to the external power supply to receive the supply voltage and configured to generate a main digital reset signal based upon the level of the supply voltage, wherein the fast reset circuit is further configured to detect that the level of the supply voltage is below a predetermined threshold voltage for a first predetermined period of time.

2. The sensor integrated circuit of claim 1, further comprising a slow reset circuit coupled to the external power supply to receive the supply voltage and configured to generate a disturb immune memory reset signal based upon the level of the supply voltage.

3. The sensor integrated circuit of claim 2, wherein the slow reset circuit is further configured to detect that the level of the supply voltage is below the predetermined threshold voltage for a second predetermined period of time, greater than the first predetermined period of time.

4. The sensor integrated circuit of claim 1, further comprising a fast over-voltage detection circuit coupled to the external power supply to receive the supply voltage and configured to generate a clock blanking signal based upon the level of the supply voltage.

5. The sensor integrated circuit of claim 4, wherein the fast over-voltage detection circuit is further configured to detect that the level of the supply voltage is above a predetermined over-voltage threshold.

6. The sensor integrated circuit of claim 5, further comprising a clock blanking circuit coupled to the fast over-voltage detection circuit and the fast reset circuit to receive the clock blanking signal and the main digital reset signal, wherein the clock blanking circuit is configured to block a clock signal provided to the disturb immune memory based upon the clock blanking signal and the main digital reset signal.

7. The sensor integrated circuit of claim 6, wherein the clock blanking circuit is further configured to filter at least one partial clock pulse from the clock signal provided to the disturb immune memory.

8. The sensor integrated circuit of claim 1, further comprising a storage capacitor coupled to receive the regulated voltage and configured to generate an extended regulated voltage for powering the disturb immune memory.

9. The sensor integrated circuit of claim 8, further comprising a one-way switch coupled between the regulator and the storage capacitor.

10. The sensor integrated circuit of claim 9, wherein the one-way switch is configured to be closed when the regulated voltage is greater than the extended regulated voltage.

11. The sensor integrated circuit of claim 1, wherein the data comprises at least one of a filter parameter or a state machine state.

12. A method for resetting a register in a sensor integrated circuit, comprising:
storing data in a disturb immune memory;
detecting that a level of a supply voltage coupled to the sensor integrated circuit is below a predetermined threshold voltage for a first period of time or for a second period of time longer than the first period of time; and
performing one of a slow reset or fast reset according to whether the supply voltage is below the predetermined threshold voltage for the first period of time or the second period of time, wherein the fast reset comprises resetting a main register according to the data stored in the disturb immune memory and wherein the slow reset comprises resetting the main register according to a default state.

13. The method of claim 12, further comprising:
performing the fast reset when the supply voltage is below the predetermined threshold voltage for at least the first period of time.

14. The method of claim 12, further comprising:
performing the slow reset when the supply voltage is below the predetermined threshold voltage for a period of time greater than both the first and second periods of time.

15. The method of claim 12, wherein storing the data comprises storing at least one of a filter parameter or a state machine state.

16. The method of claim 12, further comprising:
providing a clock signal to the disturb immune memory when the main register is reset.

17. The method of claim 16, further comprising:
detecting that a level of a supply voltage coupled to the sensor integrated circuit is above a predetermined over-voltage threshold.

18. The method of claim 17, further comprising:
preventing the clock signal from being provided to the disturb immune memory when the level of the supply voltage is above the predetermined over-voltage threshold.

19. The method of claim 17, further comprising:
preventing the clock signal from being provided to the disturb immune memory when the level of the supply voltage is below the predetermined threshold voltage.

20. The method of claim 12, further comprising:
detecting that a regulated voltage is below an extended regulated voltage.

21. The method of claim 20, further comprising:
opening a one-way switch when the regulated voltage is below the extended regulated voltage.

22. A sensor integrated circuit having a power pin for coupling to an external power supply that provides a supply voltage, a regulator for generating a regulated voltage based upon the supply voltage, and a functional circuit, comprising:
means for generating a slow reset signal according to a level of the supply voltage;
means for generating a fast reset signal according to the level of the supply voltage; and
means for resetting a main register according at least one of the fast reset signal and the slow reset signal.

23. The sensor integrated circuit of claim 22, further comprising:
means for determining that the level of the supply voltage is less than a predetermined threshold voltage for a period of time.

24. The sensor integrated circuit of claim 22, further comprising:
means for determining that the level of the supply voltage is greater than a predetermined over-voltage threshold.

25. The sensor integrated circuit of claim 22, further comprising:
means for resetting data stored in a disturb immune memory according to the supply voltage.

26. The sensor integrated circuit of claim 22, further comprising:
means for preventing a clock signal from being provided to a disturb immune memory according to the level of the supply voltage.

27. A sensor integrated circuit having a power pin for coupling to an external power supply that provides a supply voltage, a regulator for generating a regulated voltage based upon the supply voltage, and a functional circuit, comprising:
a disturb immune memory configured to store data;
a digital processor coupled to the disturb immune memory and comprising a main register, wherein the digital processor is configured to:
perform one of a fast reset or slow reset of the main register according to a level of the supply voltage;
wherein the fast reset comprises resetting the main register according to the data stored in the disturb immune memory; and
wherein the slow reset comprises resetting the main register according to a default state;
a fast reset circuit coupled to the external power supply to receive the supply voltage and configured to generate a main digital reset signal based upon the level of the supply voltage; and
a fast over-voltage detection circuit coupled to the external power supply to receive the supply voltage and configured to generate a clock blanking signal based upon the level of the supply voltage.

28. The sensor integrated circuit of claim 27, wherein the fast over-voltage detection circuit is further configured to detect that the level of the supply voltage is above a predetermined over-voltage threshold.

29. The sensor integrated circuit of claim 28, further comprising a clock blanking circuit coupled to the fast over-voltage detection circuit and the fast reset circuit to receive the clock blanking signal and the main digital reset signal, wherein the clock blanking circuit is configured to block a clock signal provided to the disturb immune memory based upon the clock blanking signal and the main digital reset signal.

30. The sensor integrated circuit of claim 29, wherein the clock blanking circuit is further configured to filter at least one partial clock pulse from the clock signal provided to the disturb immune memory.

31. The sensor integrated circuit of claim 27, wherein the fast reset circuit is further configured to detect that the level of the supply voltage is below a predetermined threshold voltage for a first predetermined period of time.

32. The sensor integrated circuit of claim 31, further comprising a slow reset circuit coupled to the external power supply to receive the supply voltage and configured to generate a disturb immune memory reset signal based upon the level of the supply voltage.

33. The sensor integrated circuit of claim 32, wherein the slow reset circuit is further configured to detect that the level of the supply voltage is below the predetermined threshold voltage for a second predetermined period of time, greater than the first predetermined period of time.

34. The sensor integrated circuit of claim 27, further comprising a storage capacitor coupled to receive the regulated voltage and configured to generate an extended regulated voltage for powering the disturb immune memory.

35. The sensor integrated circuit of claim 34, further comprising a one-way switch coupled between the regulator and the storage capacitor.

36. The sensor integrated circuit of claim 35, wherein the one-way switch is configured to be closed when the regulated voltage is greater than the extended regulated voltage.

37. The sensor integrated circuit of claim 27, wherein the data comprises at least one of a filter parameter or a state machine state.

38. A sensor integrated circuit having a power pin for coupling to an external power supply that provides a supply voltage, a regulator for generating a regulated voltage based upon the supply voltage, and a functional circuit, comprising:
   a disturb immune memory configured to store data;
   a digital processor coupled to the disturb immune memory and comprising a main register, wherein the digital processor is configured to:
      perform one of a fast reset or slow reset of the main register according to a level of the supply voltage;
      wherein the fast reset comprises resetting the main register according to the data stored in the disturb immune memory; and
      wherein the slow reset comprises resetting the main register according to a default state;
   a storage capacitor coupled to receive the regulated voltage and configured to generate an extended regulated voltage for powering the disturb immune memory; and
   a one-way switch coupled between the regulator and the storage capacitor.

39. The sensor integrated circuit of claim 38, wherein the one-way switch is configured to be closed when the regulated voltage is greater than the extended regulated voltage.

40. The sensor integrated circuit of claim 38, further comprising a fast reset circuit coupled to the external power supply to receive the supply voltage and configured to generate a main digital reset signal based upon the level of the supply voltage.

41. The sensor integrated circuit of claim 40, wherein the fast reset circuit is further configured to detect that the level of the supply voltage is below a predetermined threshold voltage for a first predetermined period of time.

42. The sensor integrated circuit of claim 41, further comprising a slow reset circuit coupled to the external power supply to receive the supply voltage and configured to generate a disturb immune memory reset signal based upon the level of the supply voltage.

43. The sensor integrated circuit of claim 42, wherein the slow reset circuit is further configured to detect that the level of the supply voltage is below the predetermined threshold voltage for a second predetermined period of time, greater than the first predetermined period of time.

44. The sensor integrated circuit of claim 40, further comprising a fast over-voltage detection circuit coupled to the external power supply to receive the supply voltage and configured to generate a clock blanking signal based upon the level of the supply voltage.

45. The sensor integrated circuit of claim 44, wherein the fast over-voltage detection circuit is further configured to detect that the level of the supply voltage is above a predetermined over-voltage threshold.

46. The sensor integrated circuit of claim 45, further comprising a clock blanking circuit coupled to the fast over-voltage detection circuit and the fast reset circuit to receive the clock blanking signal and the main digital reset signal, wherein the clock blanking circuit is configured to block a clock signal provided to the disturb immune memory based upon the clock blanking signal and the main digital reset signal.

47. The sensor integrated circuit of claim 46, wherein the clock blanking circuit is further configured to filter at least one partial clock pulse from the clock signal provided to the disturb immune memory.

48. The sensor integrated circuit of claim 38, wherein the data comprises at least one of a filter parameter or a state machine state.

* * * * *

UNITED STATES PATENT AND TRADEMARK OFFICE
CERTIFICATE OF CORRECTION

PATENT NO. : 10,635,539 B2
APPLICATION NO. : 15/967822
DATED : April 28, 2020
INVENTOR(S) : Aaron Cook et al.

Page 1 of 1

It is certified that error appears in the above-identified patent and that said Letters Patent is hereby corrected as shown below:

In the Specification

Column 11, Line 10 delete "MOSETS" and replace with --MOSFETS--.

Column 13, Line 47 delete "achieve to the desired" and replace with --achieve the desired--.

Signed and Sealed this
Twenty-second Day of September, 2020

Andrei Iancu
*Director of the United States Patent and Trademark Office*